(12) United States Patent
Tokunaga et al.

(10) Patent No.: US 8,207,456 B2
(45) Date of Patent: Jun. 26, 2012

(54) ELECTRONIC CIRCUIT DEVICE FOR COMPRESSOR

(75) Inventors: Shigetomi Tokunaga, Shiga (JP);
Kiwamu Watanabe, Shiga (JP)

(73) Assignee: Panasonic Corporation, Osaka (JP)

( * ) Notice: Subject to any disclaimer, the term of this patent is extended or adjusted under 35 U.S.C. 154(b) by 352 days.

(21) Appl. No.: 12/699,443

(22) Filed: Feb. 3, 2010

(65) Prior Publication Data

US 2010/0200290 A1    Aug. 12, 2010

(30) Foreign Application Priority Data

Feb. 12, 2009    (JP) ................................. 2009-029441

(51) Int. Cl.
    *H05K 7/20*    (2006.01)
(52) U.S. Cl. .......................... 174/548; 174/560; 361/718
(58) Field of Classification Search .................. 174/548, 174/560; 361/718
    See application file for complete search history.

(56) References Cited

U.S. PATENT DOCUMENTS

| | | | |
|---|---|---|---|
| 6,374,912 B1 * | 4/2002 | LaGrotta et al. ............... | 165/185 |
| 6,549,409 B1 * | 4/2003 | Saxelby et al. ................ | 361/704 |
| 6,680,849 B2 * | 1/2004 | Atkinson et al. ............... | 361/719 |
| 6,778,388 B1 * | 8/2004 | Minelli .......................... | 361/690 |
| 6,797,880 B2 * | 9/2004 | Kirchberger et al. ......... | 174/548 |
| 6,903,270 B1 * | 6/2005 | Hawks et al. .................. | 174/521 |
| 7,272,015 B2 * | 9/2007 | Karrer et al. ................... | 361/790 |
| 7,750,252 B2 * | 7/2010 | Colby et al. ................... | 174/548 |
| 7,760,507 B2 * | 7/2010 | Jewram et al. ................. | 361/713 |
| 7,764,500 B2 * | 7/2010 | Li et al. .......................... | 361/700 |
| 7,863,528 B2 * | 1/2011 | Poidl ............................... | 174/548 |
| 7,864,534 B2 * | 1/2011 | Wayman et al. ............... | 361/716 |
| 7,948,767 B2 * | 5/2011 | Chen .............................. | 361/761 |
| 2007/0041160 A1 | 2/2007 | Kehret et al. | |
| 2009/0161320 A1 | 6/2009 | Sugiyama et al. | |

FOREIGN PATENT DOCUMENTS

| | | |
|---|---|---|
| DE | 29 20 578 | 12/1980 |
| JP | 4-297093 | 10/1992 |
| JP | 11-317570 | 11/1999 |
| JP | 2006-24746 | 1/2006 |
| JP | 2006-66623 | 3/2006 |
| JP | 2006-140192 | 6/2006 |
| JP | 2008-85112 | 4/2008 |
| WO | 2008/032811 | 3/2008 |

* cited by examiner

*Primary Examiner* — Hung Ngo
(74) *Attorney, Agent, or Firm* — Hamre, Schumann, Mueller & Larson, P.C.

(57) ABSTRACT

Including a storage box for accommodating a printed circuit board having a heat sink, an aluminum plate for closing an opening part of the storage box, and a rubber bush for supporting the printed circuit board from an opposite side of the opening part, the heat sink and the aluminum plate are brought to contact with each other by way of the insulating sheet, so that the heat of the heat sink may be transmitted to the aluminum plate, and released.

6 Claims, 6 Drawing Sheets

37a

ELECTRONIC CIRCUIT DEVICE FOR COMPRESSOR

TECHNICAL FIELD

The present invention relates to an electronic circuit device for a compressor having a configuration of accommodating a printed circuit board for driving a compressor in a storage box.

BACKGROUND ART

In a conventional electronic circuit device for a compressor, a printing circuit board on which an electronic component such as a semiconductor element is mounted is put into a storage box from an opening part of the storage box, and the opening part is closed with a lid. A fixing structure of the printed circuit board in the conventional electronic circuit device for the compressor is explained, for example, by referring to an electronic circuit device for a compressor disclosed in Unexamined Japanese Patent Application Publication No. 11-317570 (patent document 1).

FIG. 8 is a perspective exploded view of the conventional electronic circuit device for the compressor disclosed in patent document 1. In FIG. 8, storage box 100 is composed by injection molding of nylon, ABS resin, or other synthetic resin. Storage box 100 has opening part 108 in a size slightly larger than printed circuit board 104 for accommodating printed circuit board 104 in its inside.

On printed circuit board 104, semiconductor element 112 for driving the compressor is mounted. To reduce the temperature, heat sink 116 formed of a metal of smooth heat conduction is tightly adhered to semiconductor element 112. Connector 120 is connected to printed circuit board 104.

Storage box 100 is opened at a position facing connector 120 when printed circuit board 104 is accommodated, and cord lead-out part 124 is formed. Hole parts 128 are formed at four corners of printed circuit board 104. Printed circuit board 104 is fixed to screw receiving parts 137 provided at four positions in a bottom part of storage box 100, by means of circuit board fixing screws 132 by making use of hole parts 128. At four corners around opening part 108 of storage box 100, mounting holes 136 are provided. Holes 142 are provided at four corners of lid 140. Lid 140 is fixed to storage box 100 by lid fixing screws 146 by making use of holes 142 and mounting holes 136, and closes opening part 108 of storage box 100.

In the conventional electronic circuit device for the compressor having such configuration, its assembling process is explained below. First, printed circuit board 104 is inserted from opening part 108 of storage box 100. Printed circuit board 104 is tightened in a plate thickness direction by circuit board fixing screws 132 in all of four hole parts 128, and is fixed to the bottom part of storage box 100. Lid 104 fixed so as to close opening part 108 of storage box 100 by means of lid fixing screws 146 by using four holes 142 and mounting holes 136. As a result, printed circuit board 104 is covered by storage box 100 and lid 140. Thus, the electronic circuit device for the compressor is assembled. Connector 120 is provided at a position facing cord lead-out part 124. Therefore, cords (not shown) for communicating with outside of the electronic circuit device for the compressor are connected by way of cord lead-out part 124.

When power is supplied to the electronic circuit device for the compressor, semiconductor element 112 is heated. Semiconductor element 112 is provided with heat sink 116, and the heat of semiconductor element 112 is released by way of heat sink 116.

In the conventional configuration, however, the heat from semiconductor element 112 transmitted to heat sink 116 is not release to the air outside of storage box 100. Accordingly, the heat of semiconductor element 112 for driving the compressor stays inside of storage box 100, and the heat is not released sufficiently. As a result, the temperature of semiconductor element 112 elevates, and the reliability of semiconductor element 112 is lowered.

Besides, along with temperature changes in the inside of storage box 100, due to difference in the coefficient of linear expansion between printed circuit board 104 and storage box 100, a stress is applied to four hole parts 128 for fixing printing circuit board 104. As a result, printed circuit board 104 may be broken.

SUMMARY

The present invention is intended to provide an electronic circuit device for a compressor capable of preventing lowering of reliability of an electronic component and breakage of a printed circuit board, due to temperature changes in a storage box.

The electronic circuit device for the compressor of the present invention includes a printed circuit board having an electronic component and a heat sink for transmitting heat of the electronic component, a storage box having an opening part for accommodating the printed circuit board, and an aluminum plate for closing the opening part of the storage box. The present invention further includes a rubber bush disposed in a bottom part of the storage box, for supporting the printed circuit board from an opposite side of the opening part, and an insulating sheet disposed between the heat sink and the aluminum plate. In the present invention, the heat sink, the insulating sheet and the aluminum plate contact with each other.

In this configuration, the heat of the electronic component is released to the outside of the storage box by way of the heat sink and the aluminum plate. Besides, if there is a difference in the coefficient of linear expansion between the heat sink and the storage box, the rubber bush functions as a buffer material.

Therefore, in the electronic circuit device for the compressor of the present invention, the heat of the electronic component mounted on the printed circuit board is released outside of the storage box, and the reliability of the electronic component is enhanced. In addition, the rubber bush functions as a buffer material, and the stress due to temperature changes is not applied to the printed circuit board, and the printed circuit board is prevented from being broken down.

DETAILED DESCRIPTION OF PREFERRED EMBODIMENTS

Preferred embodiments of the present invention are described below by reference to the accompanying drawings.

Preferred Embodiment 1

Figure 1:
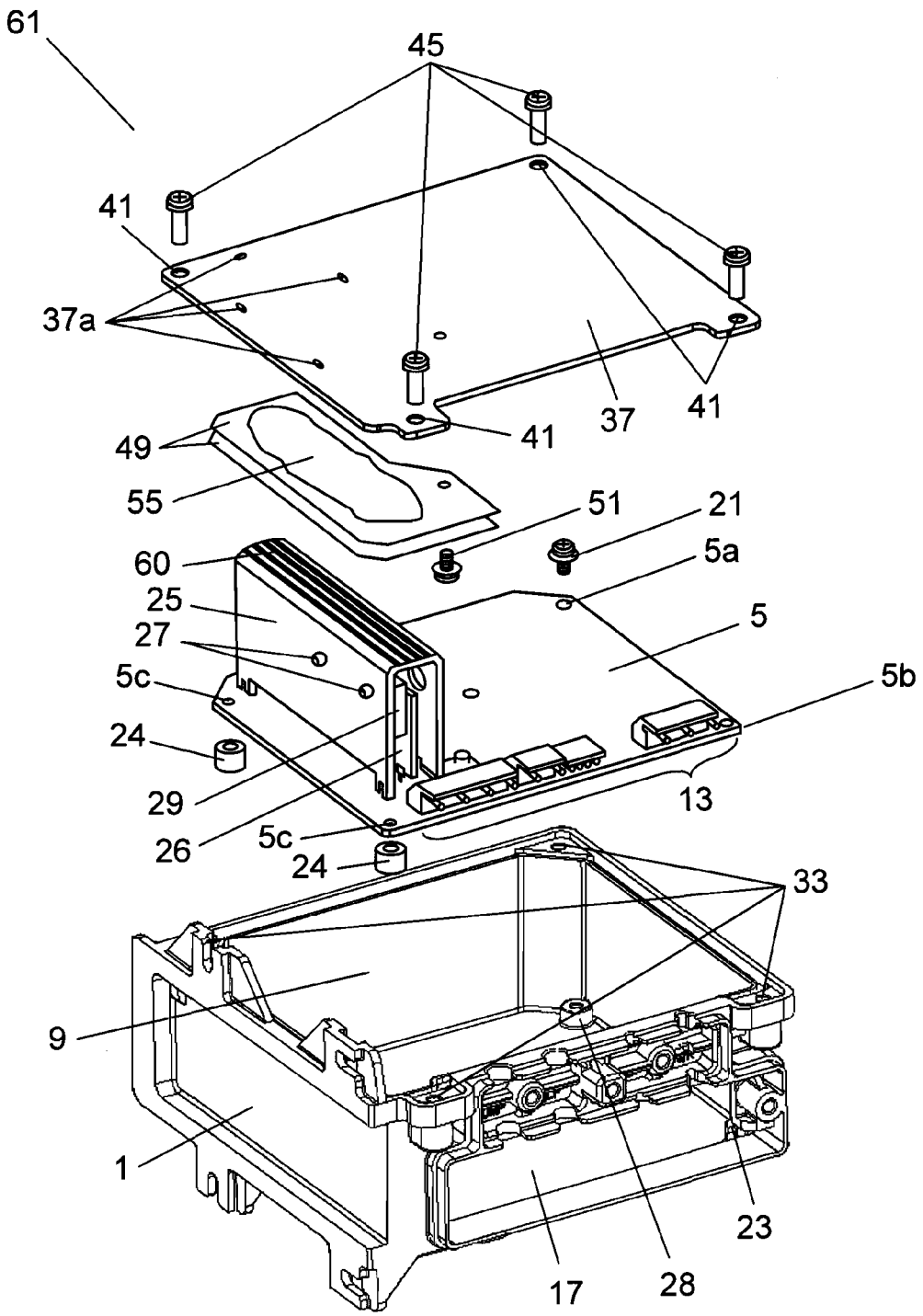
FIG. 1 is an exploded view of an electronic circuit device for a compressor in preferred embodiment 1 of the present invention.
Figure 2:
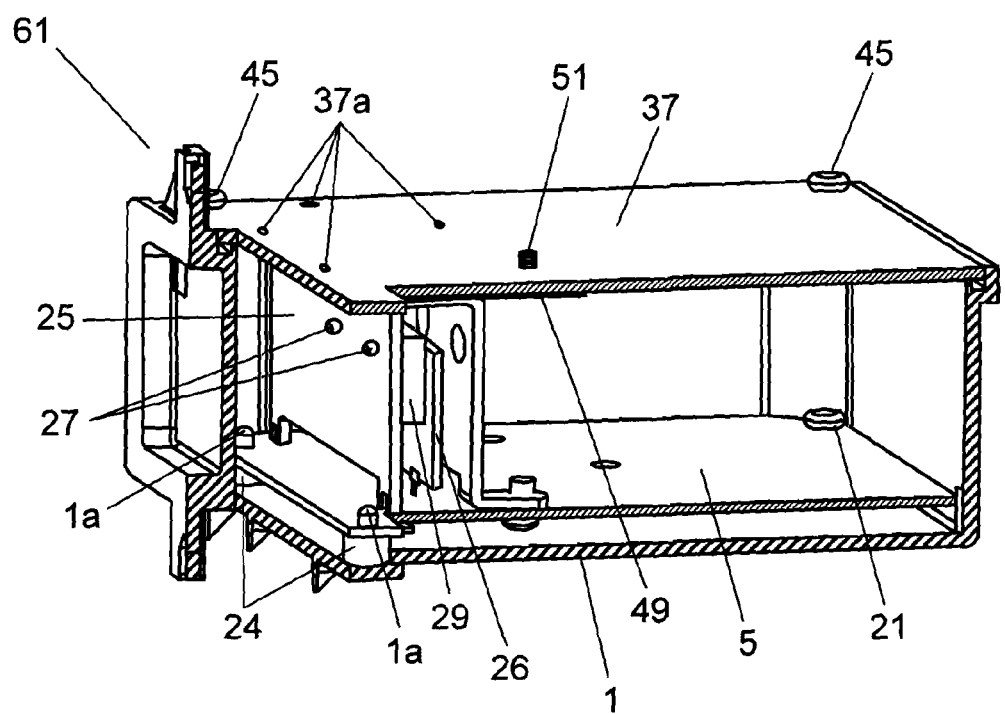
FIG. 2 is a perspective sectional view of the electronic circuit device for the compressor in the preferred embodiment.

FIG. 1 is an exploded view of an electronic circuit device for a compressor in preferred embodiment 1 of the present invention. FIG. 2 is a perspective sectional view of the electronic circuit device for the compressor in the preferred embodiment. Electronic circuit device 61 for compressor is composed as explained below. Storage box 1 has opening part 9 slightly larger than the size of printed circuit board 5 for accommodating printed circuit board 5 in its inside. Storage box 1 is composed by injection molding of a resin, such as denatured polyphenylene-ether resin. Printed circuit board 5 is made of glass cloth or glass non-woven epoxy resin. Connector 13 is mounted on printed circuit board 5. Storage box 1 is opened at a position facing connector 13 when printed circuit board 5 is accommodated, in which cord lead-out part 17 is formed.

At four corner parts of printed circuit board 5, holes are provided (four in total) for installing printed circuit board 5 in storage box 1. One of these four holes, that is, circuit board mounting screw hole 5a is fixed in screw receiving part 28 in a bottom part of storage box 1 by means of circuit board fixing screw 21. It is only at this position that printed circuit board 5 is fixed in storage box 1 by a screw.

Storage box 1 also has inserting part 23 provided at one position facing corner part 5b at an adjacent corner of the corner part provided with circuit board mounting screw hole 5a of printed circuit board 5. The clearance between inserting part 23 and the portion in which printed circuit board 5 is inserted is slightly larger than the plate thickness of printed circuit board 5. In this preferred embodiment, a hole is also provided at corner part 5b, but the present invention may be realized also if hole is not provided at corner part 5b.

Figure 3:
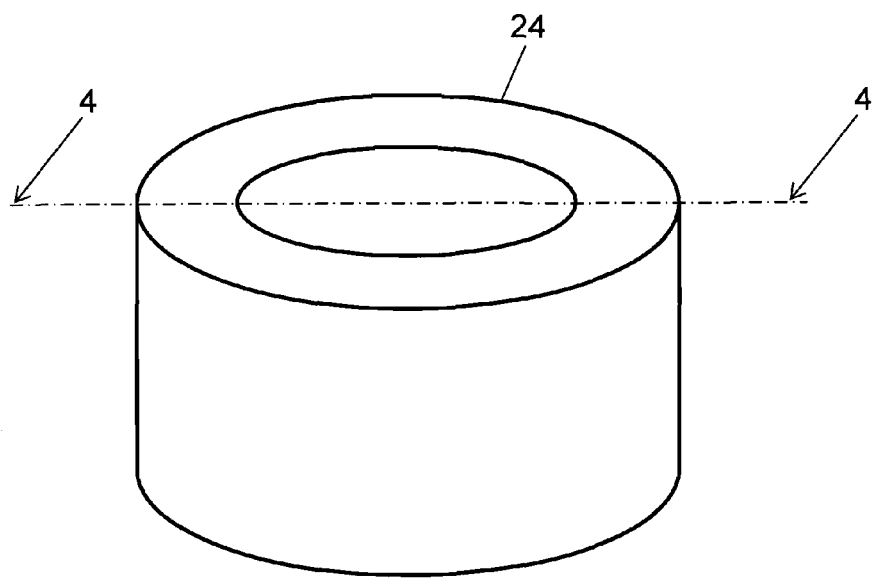
FIG. 3 is a perspective view of a rubber bush in the preferred embodiment.
Figure 4:
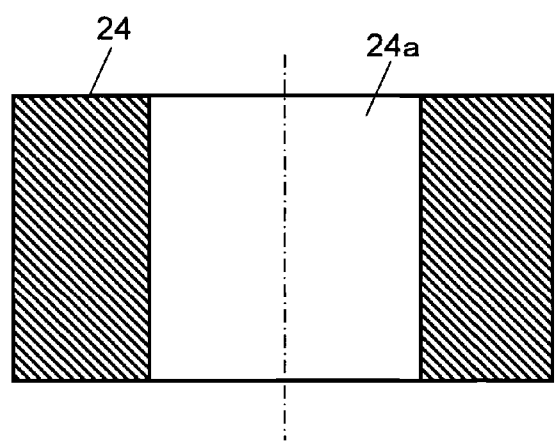
FIG. 4 is a sectional view 4-4 of the rubber bush in the preferred embodiment.

At two positions in the bottom part of storage box 1, protuberance 1a is formed integrally, projecting toward opening part 9. Protuberance 1a is provided with rubber bush 24. FIG. 3 is a perspective view of rubber bush 24. FIG. 4 is a sectional view taken along a line 4-4 of FIG. 3. As shown in FIG. 3 and FIG. 4, rubber bush 24 has a tubular shape containing hollow part 24a. Rubber bush 24 is installed so that protuberance 1a may be fitted into hollow part 24a.

The height of protuberance 1a is higher than the height of rubber bush 24. That is, when rubber bush 24 is installed in protuberance 1a, the leading end of protuberance 1a projects from rubber bush 24. Accordingly, the projecting portion is fitted into circuit board mounting holes 5c, that is, the remaining two holes out of the four holes for mounting printed circuit board 5. Thus, rubber bush 24 is held and compressed between storage box 1 and printed circuit board 5.

The hole diameter of circuit board mounting hole 5c is designed so as to allow an appropriate allowance when protuberance 1a is inserted. For example, in the case of protuberance 1a having a diameter of 3.5 mm, the hole diameter of circuit board mounting hole 5c is 4 mm.

Printed circuit board 5 has nearly inverted U-shape heat sink 25 formed by pressing of an aluminum alloy, fixed by screwing or caulking (not shown). In the inside of heat sink 25 of printed circuit board 5, semiconductor element 29 for driving the compressor is mounted as an electronic component, and semiconductor element 29 and heat sink 25 are fixed tightly with each other. Herein, in the preferred embodiment, printed circuit board 26 for semiconductor element is used in the following explanation.

Printed circuit board 26 for semiconductor element is installed in heat sink 25 as being soldered to printed circuit board 5. Semiconductor element 29 is mounted on printed circuit board 26 for semiconductor element. That is, semiconductor element 29, that is, an electronic component, is mounted on printed circuit board 5 by way of printed circuit board 26 for semiconductor element. Semiconductor element 29 is fixed to an inner wall of heat sink 25 tightly by means of screw 27. In this way, the heat of semiconductor element 29 is released by way of heat sink 25.

At four corner parts around opening part 9 of storage box 1, mounting holes 33 are provided. Aluminum plate mounting holes 41 are provided at four corner parts of aluminum plate 37 of an aluminum alloy formed by pressing. Aluminum plate 37 is fixed to storage box 1 by aluminum plate fixing screws 45 by making use of aluminum plate mounting holes 41 and mounting holes 33, and closes opening part 9 of storage box 1.

When aluminum plate 37 is fixed to storage box 1, insulating sheet 49 is fixed to the side facing the inside of storage box 1 (hereinafter called the inner side), by means of fixing screws 51, in tight contact with aluminum plate 37. Insulating sheet 49 is formed, for example, of two layers laminated together. Insulating sheet 49 has an electric insulation performance satisfying the safety standard, for example, the performance of withstanding a dielectric strength test of 1750 V for 1 minute.

Figure 5:
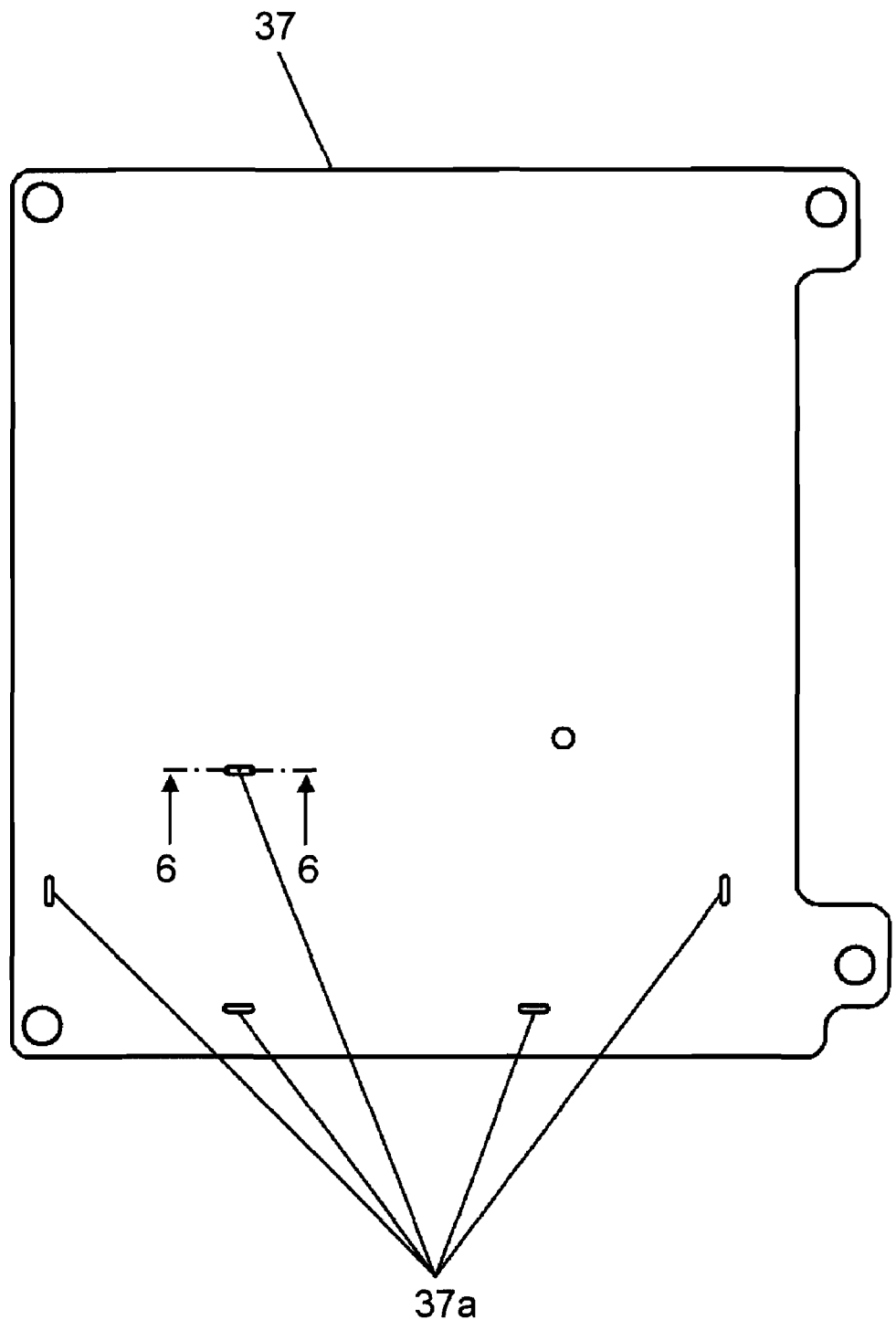
FIG. 5 is an upper side view of an aluminum plate in the preferred embodiment.
Figure 6:
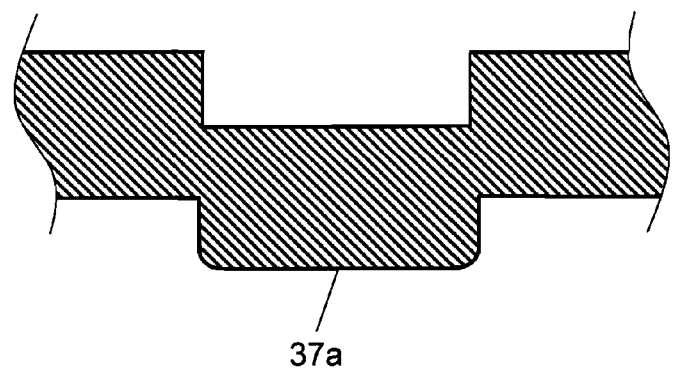
FIG. 6 is a sectional view 6-6 of the aluminum plate in the preferred embodiment.

Herein, FIG. 5 is an upper side view of aluminum plate 37. FIG. 6 is a sectional view taken along a line 6-6 of FIG. 5. As shown in FIG. 5 and FIG. 6, a plurality of protuberances 37a are formed on the inner side of aluminum plate 37, downward by pressing process or the like. Insulating sheet 49 is disposed at the inner side surrounded by the plurality of protuberances 37a, and is defined in its position by protuberances 37a.

A part of insulating sheet 49 is preliminarily coated with heat diffusion compound 55. As a result, the thermal contact between insulating sheet 49 and aluminum plate 37 is improved, and the heat conduction between insulating sheet 49 and aluminum plate 37 is enhanced.

Figure 7:
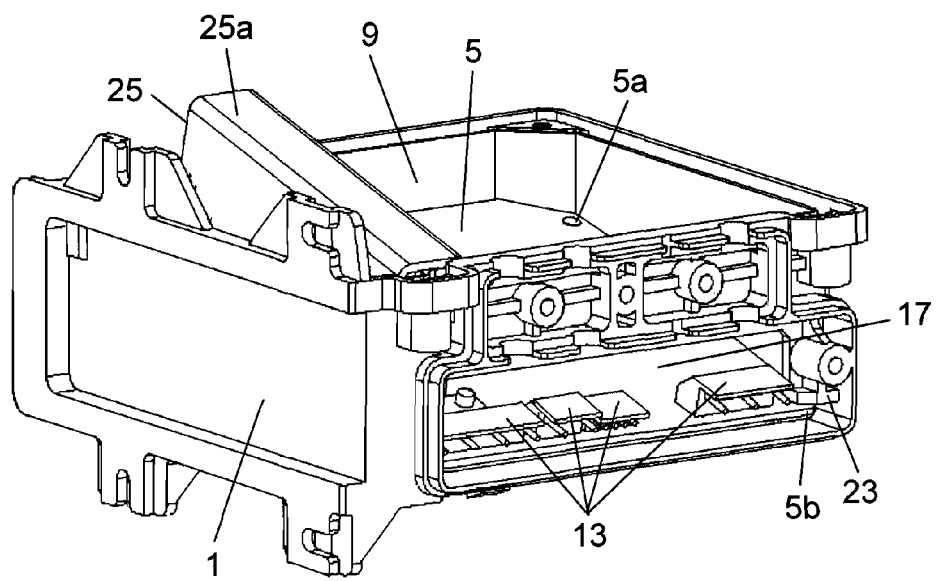
FIG. 7 is a perspective view of the electronic circuit device for the compressor in the preferred embodiment.
Figure 8:
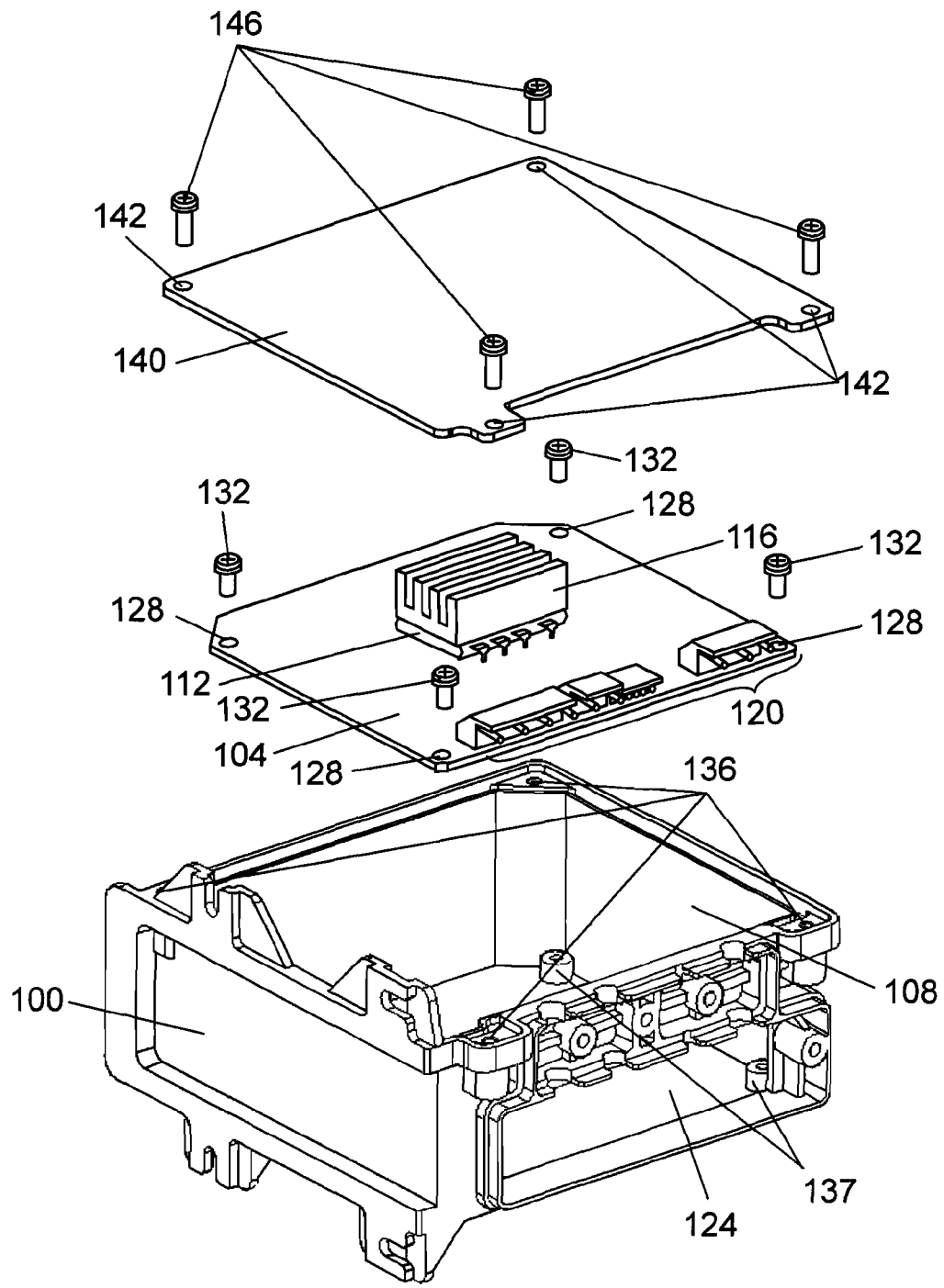
FIG. 8 is an exploded view of a conventional electronic circuit device for a compressor.

In electronic circuit device 61 for compressor having such configuration, its assembling process is explained below. First, rubber bush 24 is inserted in protuberance 1a of storage box 1. Printed circuit board 5 is inserted from opening part 9 of storage box 1, so that connector 13 may face oppositely to cord lead-out part 17 of storage box 1. Herein, as shown in a perspective view of FIG. 7, printed circuit board 5 is first inserted obliquely into opening part 9 of storage box 1 from the side of connector 13. As a result, corner 5b of printed circuit board 5 is fitted into inserting part 23. Next, printed circuit board 5 is placed at a prescribed position so that connector 13 may be parallel to storage box 1. At the same time, two protruding parts 1a of storage box 1 are inserted into circuit board mounting holes 5c of printed circuit board 5. Later, circuit board mounting screw hole 5a of printed circuit board 5 is fixed to storage box 1 by means of circuit board fixing screw 21. Heat conductive adhesive 60 is applied to upper side 25a (see FIG. 7) of the side facing insulating sheet 49 of heat sink 25. Not limited to upper side 25a of heat sink 25, however, heat conductive adhesive 60 may be also applied to the side facing upper side 25a of heat sink 25 of insulating sheet 49, or may be applied to the both sides.

On the other hand, the process of mounting insulating sheet 49 on aluminum plate 37 is explained below. Insulating sheet 49 is provided in a range surrounded by protuberances 37a provided at the inner side of aluminum plate 37, by means of one fixing screw 51. When insulating sheet 49 is tightened by this fixing screw 51, usually, insulating sheet 49 rotates in a same direction as the tightening rotation direction of fixing screw 51 around fixing screw 51. In the preferred embodiment, however, since the rotation is defined by protuberances 37a, insulating sheet 49 is installed on aluminum plate 37 at a correct position. Meanwhile, heat diffusion compound 55 is preliminarily applied to the contact surfaces of insulating sheet 49 and aluminum plate 37.

Aluminum plate 37 is installed in storage box 1 before heat conductive adhesive 60 applied to upper side 25a of heat sink 25 is cured. Specifically, aluminum plate 37 is fixed in storage box 1 by means of aluminum plate fixing screw 45 by using aluminum plate mounting hole 41 and mounting hole 33, and closes opening part 9 of storage box 1. In this case, upper side 25a of heat sink 25 is set to be slightly higher than the upper side of opening part 9 of storage box 1, by, for example, about 2 mm. As a result, heat sink 25 is pushed by aluminum plate 37 which closes opening part 9, and rubber bush 24 beneath printed circuit board 5 is compressed in a vertical direction.

In this case, heat conductive adhesive 60 applied to upper side 25a of heat sink 25 is held and compressed between aluminum plate 37 having insulating sheet 49 and heat sink 25. Herein, heat sink 25 and printed circuit board 5 are preferably installed vertically. If installed not vertically, insulating sheet 49 and heat sink 25 may contact with each other only by point or linearly. In the case of point contact or linear contact, gaps are formed between insulating sheet 49 and heat sink 25, and the heat conduction efficiency is lowered. In the preferred embodiment, however, if heat sink 25 and printed circuit board 5 are not installed vertically, heat conductive adhesive 60 is compressed, and these gaps are filled with heat conductive adhesive 60. Hence, the heat conduction efficiency from heat sink 25 to aluminum plate 37 is not lowered.

When power is supplied to electronic circuit device 61 for compressor assembled in this manner, semiconductor element 29 is heated. The heat generated in semiconductor element 29 is transmitted finally to aluminum plate 37, sequentially by way of heat sink 25, heat conductive adhesive 60, insulating sheet 49, and heat diffusion compound 55. In this manner, the heat generated in semiconductor element 29 is efficiently released to outside of storage box 1. Therefore, the temperature of semiconductor element 29 is not elevated abnormally, and the reliability of electronic circuit device 61 for compressor is enhanced.

Moreover, since insulating sheet 49 is provided between aluminum plate 37 and heat sink 25, for example, in the event of short-circuiting of aluminum plate 37 and a live part of printed circuit board 5, the insulation of aluminum plate 37 is assured. If electronic circuit device 61 for compressor is installed in an environment in which aluminum plate 37 may be touched by hand, electronic circuit device 61 for compressor of higher safety may be obtained.

Further, printed circuit board 5 is fixed in storage box 1 at one position only, by means of circuit board mounting screw hole 5a and circuit board fixing screw 21. Therefore, if the coefficient of linear expansion differs between printed circuit board 5 and storage box 1, circuit board mounting screw hole 5a is free from stress due to thermal expansion. In other words, printed circuit board 5 is not broken. Hence, the reliability of electronic circuit device 61 for compressor is assured even if the temperature of electronic circuit device 61 for compressor is elevated due to heat generation of the electronic component mounted on printed circuit board 5 or temperature rise of outside of storage box 1.

Further, even in the event of temperature rise of electronic circuit device 61 for compressor, rubber bush 24 absorbs the difference of thermal expansion difference due to difference in coefficient of linear expansion between storage box 1 and heat sink 25. Accordingly, the close contact of heat sink 25 and aluminum plate 37 is assured, and the heat due to heat generation of semiconductor element 29 is securely transmitted to aluminum plate 37. As a result, excessive temperature rise of semiconductor element 29 is prevented, and the reliability of electronic circuit device 61 for compressor is enhanced.

For example, when the temperature of electronic circuit device 61 for compressor is elevated due to feeding of power or temperature rise in the surrounding, storage box 1 and heat sink 25 are expanded thermally in the vertical direction. The coefficient of linear expansion of storage box 1 which is made of resin is about $7 \times 10^{-5}$/K. On the other hand, the coefficient of linear expansion of heat sink 25 which is made of aluminum is about $2 \times 10^{-5}$/K. Therefore, in the case of heat sink 25 measuring 40 mm, for example, in the dimension in the vertical direction, if the temperature of electronic circuit device 61 for compressor is elevated by 50 K, the dimension of storage box 1 in the vertical direction is extended by 0.1 mm as compared with the dimension of heat sink 25 in the vertical direction. Herein, since rubber bush 24 is preliminarily compressed by 2 mm in the vertical direction, and printed circuit board 5 is pushed up in the vertical direction, the compression dimension is 1.9 mm. In other words, no gap is formed between heat sink 25 and aluminum plate 37.

In the mounting process of rubber bush 24, moreover, only rubber bush 24 is inserted into protuberance 1a of storage box 1. Accordingly, the assembling process is easy. That is, the working efficiency is enhanced when assembling electronic circuit device 61 for compressor.

Further, the mounting position of printed circuit board 5 is determined by protuberance 1a. At the same time, protuberance 1a prevents printed circuit board 5 from moving in the horizontal direction. In this case, too, the assembling working efficiency of electronic circuit device 61 for compressor is enhanced.

Moreover, in the process of mounting of insulating sheet 49 on aluminum plate 37, protuberance 37a allows insulating sheet 49 to be installed at a prescribed position securely only by one fixing screw 51. Hence, the working efficiency is enhanced when installing insulating sheet 49. Besides, since insulating sheet 49 is installed at a correct position, electronic circuit device 61 for compressor is enhanced in safety against electric shock.

In principle, heat sink 25 is installed vertically on printed circuit board 5, and upper side 25a of heat sink 25, aluminum plate 37, and insulating sheet 49 contact with each other by surface. Herein, if heat sink 25 is installed obliquely in printed circuit board 5 due to fluctuations in assembling, usually, upper side 25a of heat sink 25 and insulating sheet 49 contact with each other linearly or by point. In this preferred embodiment, however, heat conductive adhesive 60 is applied to fill between heat sink 25 and insulating sheet 49. Hence, the heat by heat generation of semiconductor element 29 is transmitted securely from heat sink 25 to aluminum plate 37. Therefore, an excessive temperature rise of semiconductor element 29 is prevented, and electronic circuit device 61 for compressor of high reliability is obtained.

In addition, since heat diffusion compound 55 is applied on the contact surfaces of insulating sheet 49 and aluminum plate 37, if aluminum plate 37 is deformed, gaps formed between insulating sheet 49 and aluminum plate 37 can be filled up with heat diffusion compound 55. As a result, the heat by heat generation of semiconductor element 29 is transmitted securely from heat sink 25 to aluminum plate 37. Therefore, an excessive temperature rise of semiconductor element 29 is prevented, and electronic circuit device 61 for compressor of high reliability is obtained.

As explained herein, the present invention includes a printed circuit board having an electronic component and a heat sink for transmitting the heat of the electronic component, a storage box having an opening part for accommodating the printed circuit board, and an aluminum plate for closing the opening part of the storage box. The present invention further includes a rubber bush disposed in a bottom part of the storage box, for supporting the printed circuit board from an opposite side of the opening part, and an insulating sheet disposed between the heat sink and the aluminum plate. In the present invention, further, the heat sink, the insulating sheet and the aluminum plate contact tightly with each other.

Accordingly, the heat of the electronic component is transmitted to the aluminum plate, and is released to the outside of the storage box. In addition, since an excessive stress due to temperate change is not applied, an electronic circuit device for a compressor of a high reliability is obtained. Still more, since the heat sink and the aluminum plate are insulated by the insulating sheet, if the heat sink contacts with a live part in the inside of the storage box, the insulation of the aluminum plate is assured.

In the present invention, the rubber bush is formed in a tubular shape having a hollow part, and the printed circuit board has a circuit board mounting hole, and the storage box has a protruding part projecting from a bottom part toward an opening part. Further, in the present invention, the hollow part of the rubber bush and the circuit board mounting hole of the printed circuit board are both inserted into the protruding part of the storage box.

Accordingly, the printed circuit board is disposed at a prescribed position in the storage box. Further, it is easier to install the rubber bush in the storage box. That is, an electronic circuit device for a compressor excellent in assembling working efficiency and low in cost is obtained.

In the present invention, moreover, the printed circuit board has a circuit board mounting screw hole, and a screw receiving part is formed in a bottom part of the storage box. Also in the present invention, the printed circuit board and the storage box are fixed by a screw at one position only by making use of the circuit board mounting screw hole and the screw receiving part. Hence, if the coefficient of linear expansion differs between the printed circuit board and the storage box, stress due to thermal expansion is not applied to the printed circuit board. Therefore, an electronic circuit device for a compressor assured in the reliability is obtained.

Furthermore, in the present invention, a plurality of protruding parts are provided at the side facing the inner side of the storage box of the aluminum plate, and an insulating sheet is disposed in a range surrounded by the protruding parts. As a result, the insulating sheet is positioned and disposed accurately at a prescribed position of the aluminum plate. Further, an electronic circuit device for a compressor excellent in assembling working efficiency, and low in cost and high in safety is obtained.

In the present invention, still more, a heat conductive adhesive is applied between the insulating sheet and the heat sink. As a result, heat is transmitted securely among the heat sink, the aluminum plate, and the insulating sheet.

Moreover, in the present invention, a heat diffusion compound is applied between the insulating sheet and the aluminum plate. As a result, the thermal resistance between the aluminum plate and the insulating sheet is decreased.

The invention claimed is:

1. An electronic circuit device for a compressor comprising:
   a printed circuit board having an electronic component and a heat sink for transmitting heat of the electronic component;
   a storage box having an opening part for accommodating the printed circuit board;
   an aluminum plate for closing the opening part of the storage box;
   a rubber bush disposed in a bottom part of the storage box, for supporting the printed circuit board from an opposite side of the opening part; and
   an insulating sheet disposed between the heat sink and the aluminum plate,
   wherein the heat sink, the insulating sheet and the aluminum plate contact with each other.

2. The electronic circuit device for the compressor according to claim 1,
   wherein the rubber bush is formed in a tubular shape having a hollow part,
   the printed circuit board has a circuit board mounting hole,
   the storage box has a protruding part projecting from the bottom part toward the opening part, and
   the hollow part of the rubber bush and the circuit board mounting hole of the printed circuit board are both inserted into the protruding part of the storage box.

3. The electronic circuit device for the compressor according to claim 2,
   wherein the printed circuit board further has a circuit board mounting screw hole, and the storage box further has a screw receiving part in its bottom part, and
   the printed circuit board and the storage box are fixed by a screw at one position only by making use of the printed circuit board mounting screw hole and the screw receiving part.

4. The electronic circuit device for the compressor according to claim 1,
   wherein the aluminum plate has a plurality of protruding parts disposed at a side facing an inner side of the storage box, and
   an insulating sheet is disposed in a range surrounded by the protruding parts.

5. The electronic circuit device for the compressor according to claim 1,
   wherein a heat conductive adhesive is applied between the insulating sheet and the heat sink.

6. The electronic circuit device for the compressor according to claim 1,
   wherein a heat diffusion compound is applied between the insulating sheet and the aluminum plate.

* * * * *